United States Patent
Lean et al.

(10) Patent No.: US 10,342,307 B2
(45) Date of Patent: Jul. 9, 2019

(54) CONDUCTIVE INPUT COVERINGS FOR A PROTECTIVE COVER FOR AN ELECTRONIC DEVICE

(71) Applicant: Samsonite IP Holdings S.àr.l., Luxembourg (LU)

(72) Inventors: David Lean, San Francisco, CA (US); Bryan Lee Hynecek, Redwood City, CA (US)

(73) Assignee: Samsonite IP Holdings S.àr.l., Luxembourg (LU)

( * ) Notice: Subject to any disclaimer, the term of this patent is extended or adjusted under 35 U.S.C. 154(b) by 83 days.

(21) Appl. No.: 15/038,317

(22) PCT Filed: Nov. 24, 2014

(86) PCT No.: PCT/US2014/067036
§ 371 (c)(1),
(2) Date: May 20, 2016

(87) PCT Pub. No.: WO2015/077683
PCT Pub. Date: May 28, 2015

(65) Prior Publication Data
US 2016/0286920 A1    Oct. 6, 2016

Related U.S. Application Data

(60) Provisional application No. 61/907,507, filed on Nov. 22, 2013.

(51) Int. Cl.
*G06F 1/16* (2006.01)
*H03K 17/96* (2006.01)
(Continued)

(52) U.S. Cl.
CPC ............ *A45C 11/00* (2013.01); *A45C 13/008* (2013.01); *A45F 5/00* (2013.01); *G06F 1/1656* (2013.01);
(Continued)

(58) Field of Classification Search
CPC . A45C 11/00; A45C 13/008; A45C 2011/001; A45C 2011/002;
(Continued)

(56) References Cited

U.S. PATENT DOCUMENTS 5,555,157 A * 9/1996 Moller .................. G06F 1/1626
312/223.2
8,385,060 B2 * 2/2013 Dabov .................. G06F 1/1626
29/832

(Continued)

FOREIGN PATENT DOCUMENTS

KR    2012-0104061    9/2012

OTHER PUBLICATIONS

International Search Report issued in corresponding PCT International Application No. PCT/US2014/067036 dated Jan. 28, 2015 and the Written Opinion.

*Primary Examiner* — Dimary S Lopez Cruz
*Assistant Examiner* — Ingrid D Wright
(74) *Attorney, Agent, or Firm* — Lerner, David, Littenberg, Krumholz & Mentlik, LLP

(57) ABSTRACT

A case or cover for an electronic device comprising a protective input covering portion adapted to protect an input component for the electronic device, wherein the protective input covering portion comprises a capacitive material operably positioned to operate the input component.

16 Claims, 7 Drawing Sheets

(51) Int. Cl.
  *A45C 11/00* (2006.01)
  *A45F 5/00* (2006.01)
  *H04B 1/3888* (2015.01)
  *A45C 13/00* (2006.01)
(52) U.S. Cl.
  CPC ....... *H03K 17/9622* (2013.01); *H04B 1/3888* (2013.01); *A45C 2011/001* (2013.01); *A45C 2011/002* (2013.01); *A45C 2011/003* (2013.01); *H03K 2017/9602* (2013.01)
(58) Field of Classification Search
  CPC ..... A45C 2011/003; A45C 13/02; A45F 5/00; G06F 11/1656; G06F 3/044; G06F 2203/04106; G06F 3/0414; G06F 3/0202; G06F 3/045; G06F 3/0488; G06F 3/0412; G06F 3/0416; G06F 1/1656; H03K 17/9622; H04B 1/3888
  USPC ............ 361/679.26, 679.21, 679.27, 679.01, 361/679.02, 679.55
  See application file for complete search history.

(56) References Cited

U.S. PATENT DOCUMENTS

| | | | |
|---|---|---|---|
| 2004/0188933 A1* | 9/2004 | Siciliano | A63F 13/02 273/148 B |
| 2007/0086273 A1 | 4/2007 | Polany et al. | |
| 2010/0156808 A1* | 6/2010 | Stallings | G06F 3/04886 345/173 |
| 2013/0069908 A1* | 3/2013 | Sung | G06F 3/039 345/174 |
| 2013/0082963 A1 | 4/2013 | Chu | |
| 2013/0181935 A1* | 7/2013 | McKenzie | G06F 3/044 345/174 |
| 2014/0009429 A1* | 1/2014 | Verweg | G06F 3/044 345/174 |
| 2014/0364178 A1* | 12/2014 | Hynecek | H04B 1/3888 455/575.8 |

* cited by examiner

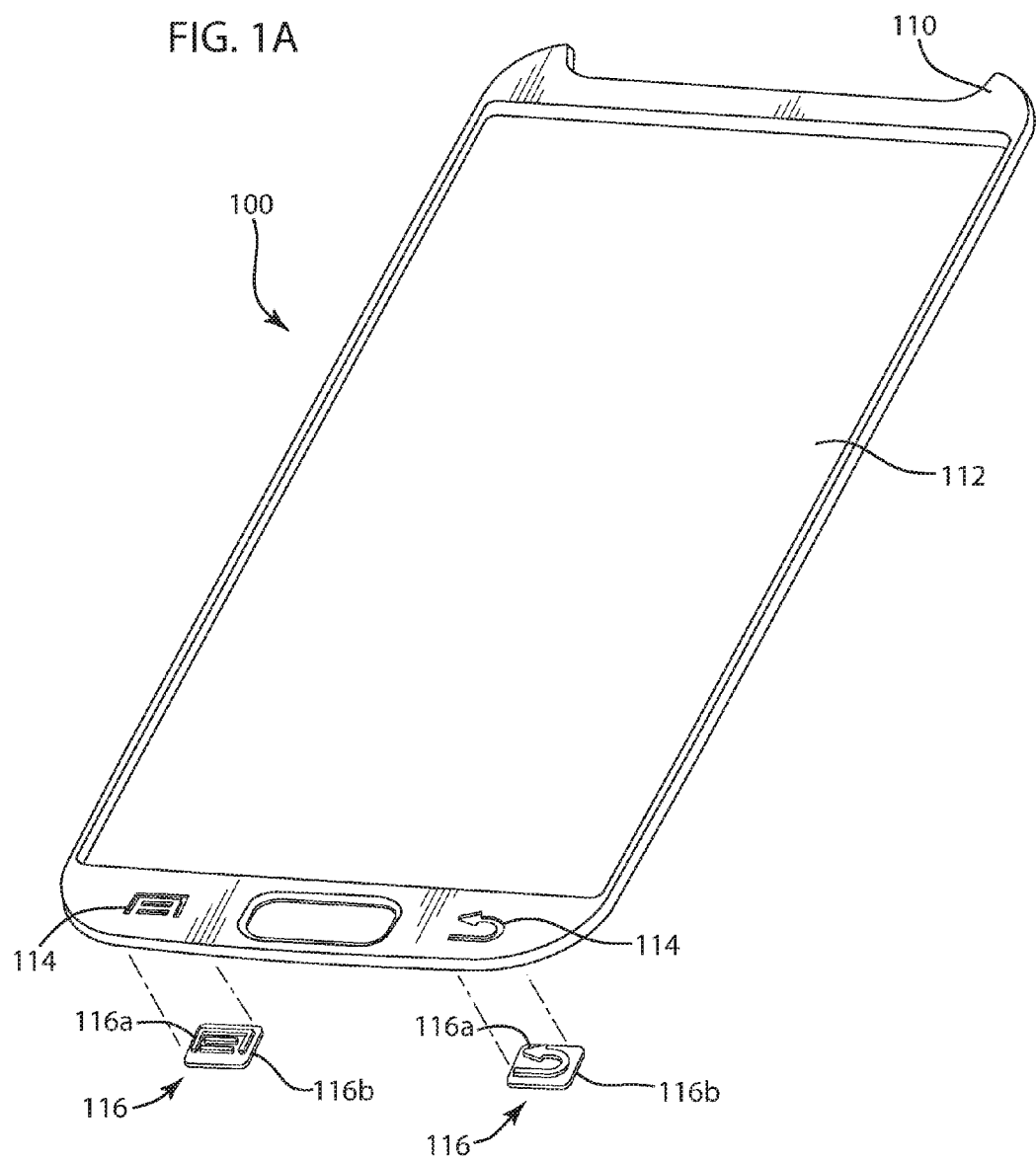

CONDUCTIVE INPUT COVERINGS FOR A PROTECTIVE COVER FOR AN ELECTRONIC DEVICE

CROSS-REFERENCE TO RELATED APPLICATIONS

This application claims priority from PCT Patent Application No. PCT/US 2014/067036 filed on Nov. 24, 2014, which claims priority to U.S. Provisional Patent Application No. 61/907,507, filed Nov. 22, 2013,and titled "CONDUCTIVE INPUT COVERINGS FOR A PROTECTIVE COVER FOR AN ELECTRONIC DEVICE", the disclosures of which are incorporated herein by reference in their entirety.

DESCRIPTION OF RELATED TECHNOLOGY

Described are buttons for a protective case or cover for a mobile device, such as a cell phone, GPS unit, MP3 player, tablet, camera, or laptop computer. When a case, skin, shield or cover is applied to the device for protection, styling, or other user desired purposes, this case needs to be configured to allow access to operation inputs such as buttons or touchscreen which allow operational inputs for the device using capacitive sensing. One cannot use a capacitive input through most types of electrically insulating materials. This disadvantage especially affects usability in consumer electronics, such as touch tablet PCs and capacitive smartphones. As such covers or cases leave inputs that use capacitive input exposed so users can access the buttons.

A user can input a specific command to a smart phone or other device having a touch screen by selecting a specific position or icon on the display of the smart phone or touch screen with a user's body part. This input scheme can be implemented through a capacitive touch screen. A capacitive touch screen generally includes transparent electrodes and condensers. As the user touches the touch screen with a body part, the touch may be sensed based on the resulting changed capacity of a condenser.

FIG. 4 is a diagram illustrating a communication device 120. Referring to FIG. 4, the communication device 120 may include a display 124 and key input units 122. The display 124 displays information to a user. The display 110 may operate in an electromagnetic resonance scheme and/or a capacitive scheme.

The key inputs 122 are a user interface provided separately from the display 124, which enables the user to intuitively perform basic functions such as back, cancel, menu display control, etc. Conventionally, the keys 122 operate only in the capacitive scheme due to limitations on accommodation of capacitive sensors and electromagnetic sensors under transparent electrodes.

As stated before, since only the capacitive scheme is used for the keys 122, traditionally the user must input commands to the keys 122 by touching keys 122 with a body part.

SUMMARY

A case or cover for an electronic device, said case or cover comprising: a protective input covering portion adapted to protect an input component for the electronic device, wherein said covering portion comprises a capacitive material and is operably positioned to operate the input component.

BRIEF DESCRIPTION OF THE DRAWINGS

FIGS. 1A-1B show an exemplary embodiment of a protective case.

DETAILED DESCRIPTION OF EMBODIMENTS

Capacitive sensing refers to technology that takes human body capacitance as input. Capacitive sensors detect anything that is conductive or has a dielectric different from that of air. Many types of sensors use capacitive sensing. Human interface devices based on capacitive sensing also include many kinds of devices, including but not limited to digital audio players, mobile phones, GPS units, MP3 players, tablet, cameras, or laptop computers and tablet computers use capacitive sensing touchscreens and key input units as input devices. Capacitive sensors can also replace or be used in conjunction with mechanical buttons or keys.

Disclosed are embodiments of a protective case 100, faceplate, or other protective covering for an electronic device 120 that comprises a protective input covering portion 116 adapted to protect an input component for the electronic device, wherein the covering portion 116 comprises a capacitive material 115 operably positioned to operate the input component.

As used herein a protective "case" or "cover" broadly encompass all forms of protective coverings and parts thereof for personal electronic devices as known in the art, including cases, skins, faceplates, shields or covers applied to the device for protection or style. Embodiments described herein are not limiting but are offered to give a clear understanding of the invention, which can be employed in all such protective cases or covers.

Figure 1B:
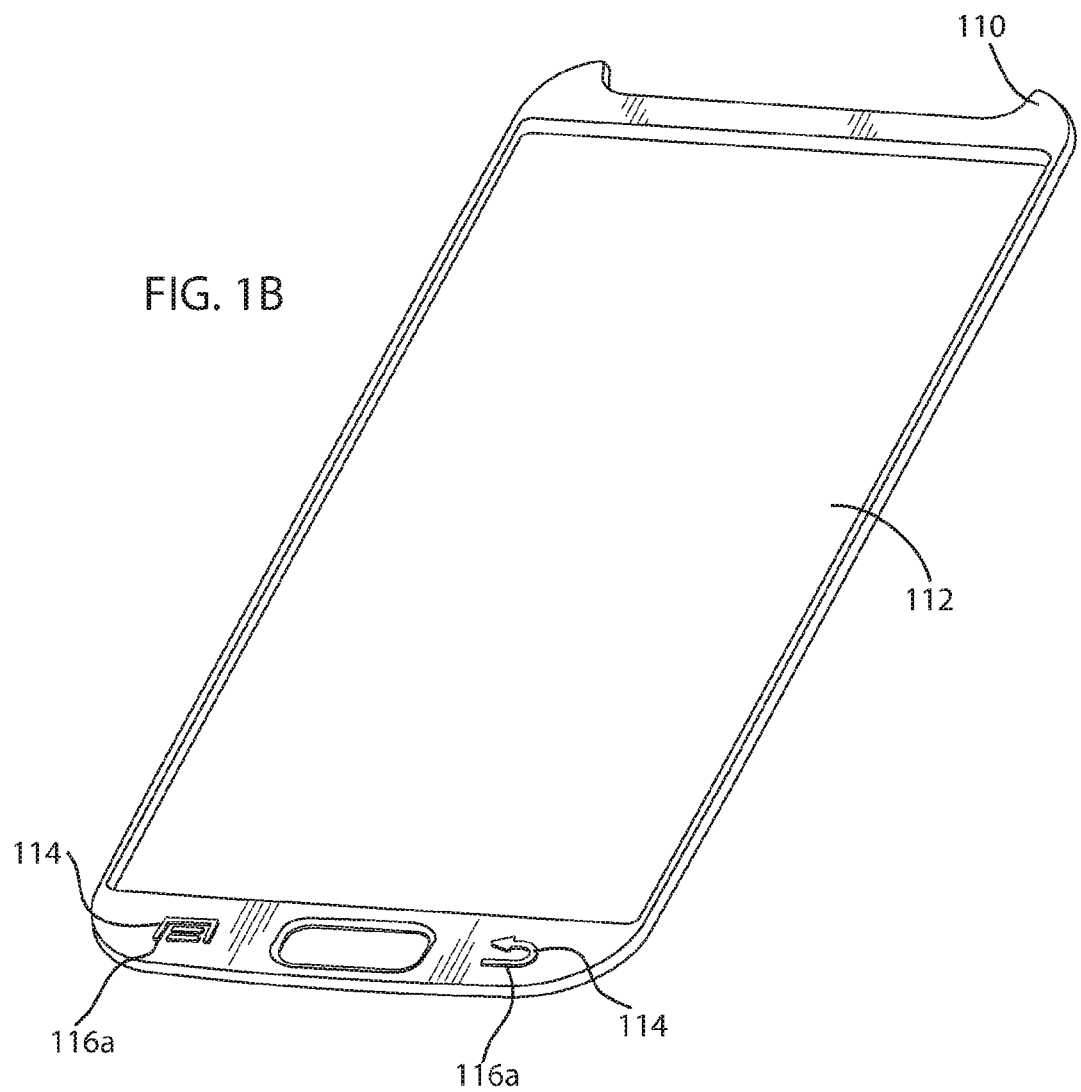

FIGS. 1A-1B show an exemplary embodiment of a protective case. In FIG. 1A, an exploded top view of a faceplate 100 for protecting a personal electronic device includes an exterior portion 110 which is configured to be fitted over a personal electronic device 120. Exemplary personal electronic devices 120 include those referred to herein, including mobile telephones, so called "smart phones" (e.g., iPhone™ Android™ or Blackberry™), laptop computers, tablet computers, digital audio players, GPS units, MP3 players, tablets, cameras, and the like. At least one exterior layer 110 includes an opening 114 configured to provide access to the input component of the device through an exterior 110 of the case.

In an embodiment at least one exterior layer includes an one or more openings 114 configured to provide access to the input component of the device through an exterior of the case.

The exterior portion 110 or shell is configured to attach and protectively cover the electronic device and incorporate at least one viewing window 112 including a screen protector, and openings or cutouts 114 are configured to accept protective input covers 116, for example molded elastomeric input covers, which are configured to act as key input units 116 for the device 120. This protective exterior shell 110 allows the device protection from impacts, and can also be configured to be watertight. In an embodiment, external layer 110 can be designed to mimic the finish of existing electronic devices, for example for users who prefer the feel and look of the original device 120 and would like to maintain that feel but still want protection for their device 120. In an embodiment, the external layer 110 can be configured to have a low coefficient of friction. This allows the device to easily be slipped in and out of pockets easily without becoming attached or without great resistance to clothing materials. Exterior layer 110 may be fabricated from, for example and without limitation, metal, a rigid or semi-rigid plastic material, a rigid rubber material, a polycarbonate material, a para-aramid material and/or some combination thereof and may be any color or texture.

As seen in FIG. 1A the exterior layer 110 comprises openings or cutouts 114 configured to accept molded elastomeric input covers 116 which are configured to cover key unit inputs 122 for the device 120. In the embodiment, the protective input covering portion 116 comprises an input contact portion 116b configured to sit beneath the at least the exterior layer 110 and contact the input portion 122 of the device 120 when operated, and a projection portion 116a adapted to project through the opening 114. The projection portion 116a is shaped to substantially match the opening 114 such that the exterior 110 and the protective input covering 116 provide a substantially impenetrable protective covering for the input, as shown in FIG. 1B. In the embodiment, one opening 114 is in the shape of a "menu" with two parallel lines surrounded by another cutout line, and the other opening 114 is in the shape of an arrow. Accordingly, the projection portions 116a are molded to have a substantially identical shapes as the negative profile formed by the openings 114—lines and an arrow respectively. As shown in FIG. 1B, the projection portions 116a extend through and above the surface of the exterior 110, thus allowing a user to press or touch the key or button 116 formed by the projection 116a. The input contact portion 116b seen in FIG. 1A is underneath the layer 110 in FIG. 1B. The input covering portion 116 comprises a capacitive material 115 and is operably positioned to operate the input component. As will be appreciated, as the protective input cover 116 is capacitive and thus forms a capacitive sensor, the key formed by the projection 116a, need not be configured to react to pressure or mechanical operation, but can operate the device by touch alone. That said, the protective can be configured to work in conjunction with mechanical inputs as well, as for example with key input units 122 that respond to both capacitive sensing and mechanical operation.

FIGS. 2A-2D show cut-away cross-sectional side views of embodiments of the protective case or covering 100 including the protective input covering portion 116. As will be appreciated, dimensions are not shown to scale, but are exaggerated to show the structural configurations more clearly. As will be appreciated, embodiments herein are shown with capacitive material in contact with key input units 122 as the sensor formed by the protective input covering portion 116 and the key input unit 122 can be responsive to touch alone. However, in embodiments it is also possible to have the protective input covering portion 116 responsive to both mechanical and capacitive sensing, and can, for example, require pressure from a user to from a contact between the protective input covering portion 116a and the key input unit 122.

Figure 2A:
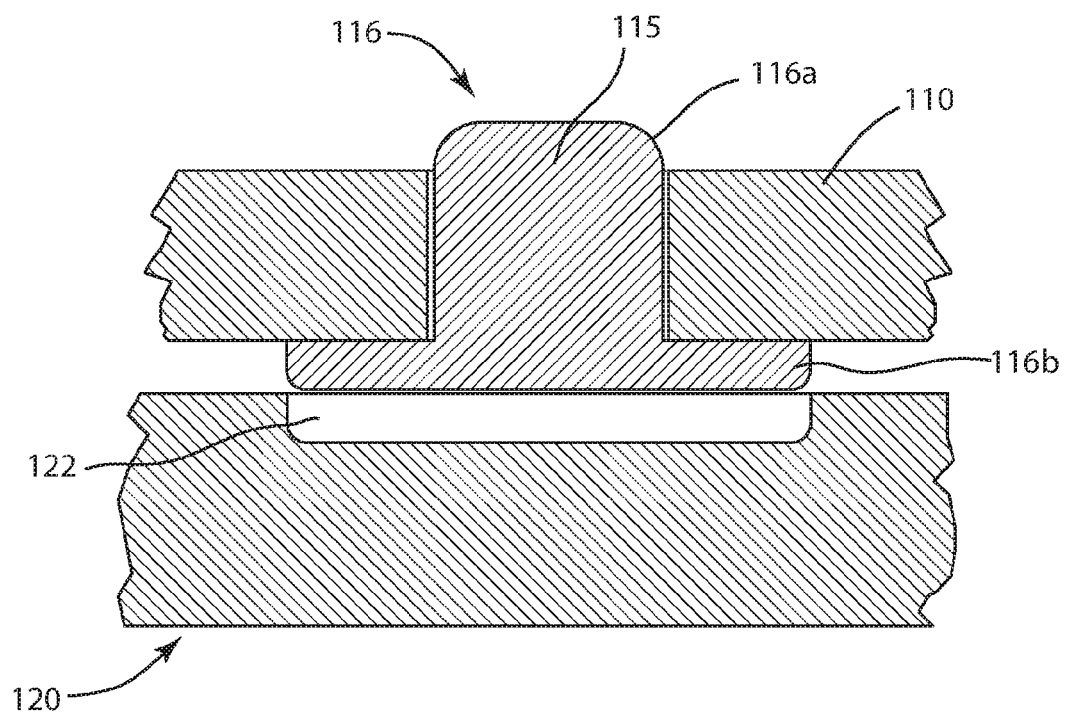
FIGS. 2A-2D show cut-away cross-sectional side views of exemplary embodiments of the protective case or covering.

In FIG. 2A an embodiment of a protective covering 116 in accord with FIGS. 1A-1B is shown. In the embodiment, the protective input covering portion 116 comprises the input contact portion 116b configured to sit beneath the at least the exterior layer 110 and contact the input portion 122 of the device when operated, for example by being pressed, and a projection portion 116a adapted to project through the opening 114 in the layer 110. The projection portion 116a is shaped to substantially match the opening 114 as noted above such that the exterior and the protective input covering can provide a substantially impenetrable protective covering for the input 122, for example to make the covering 100 waterproof or watertight. The projection portions 116a extend above the surface of the exterior 110, thus allowing a user to press or touch the key 116 formed by the projection 116a. Because the protective input covering portion 116 includes a capacitive material, only a very light touch is needed to operate the input 122.

Figure 2B:
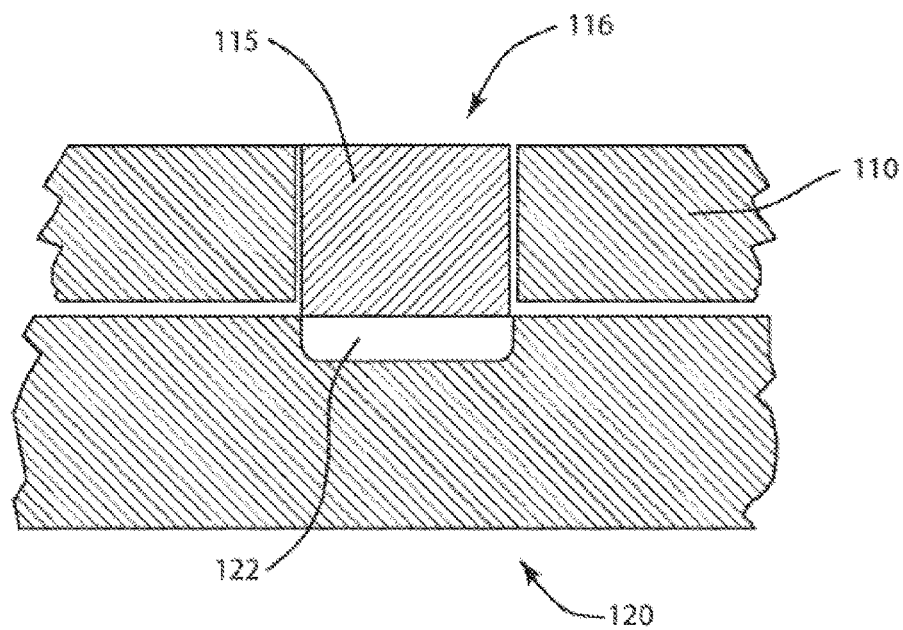

As shown in FIG. 2B, the protective input covering portion 116 is substantially co-extensive with the exterior layer instead of projecting above the exterior layer 110. The protective input covering portion 116 can be made of a material which can be partially or entirely made of capacitive or conductive material 115. Accordingly as shown in FIG. 2B, in another embodiment, the layer 110 itself can include an integral part 116a and include a capacitive conductive material 115 formed over the key input units 122 on a device, wherein a user simply presses the area on the layer 110 corresponding to the portion device input 122 that is desired. As the surface formed by the protective input covering portion 116 is integrated with the exterior 100 so as to form a flat external surface, the area over the capacitive protective input covering 116, the external surface area for the protective input covering 116 can be marked with a graphic to show where to touch the input.

Figure 2C:
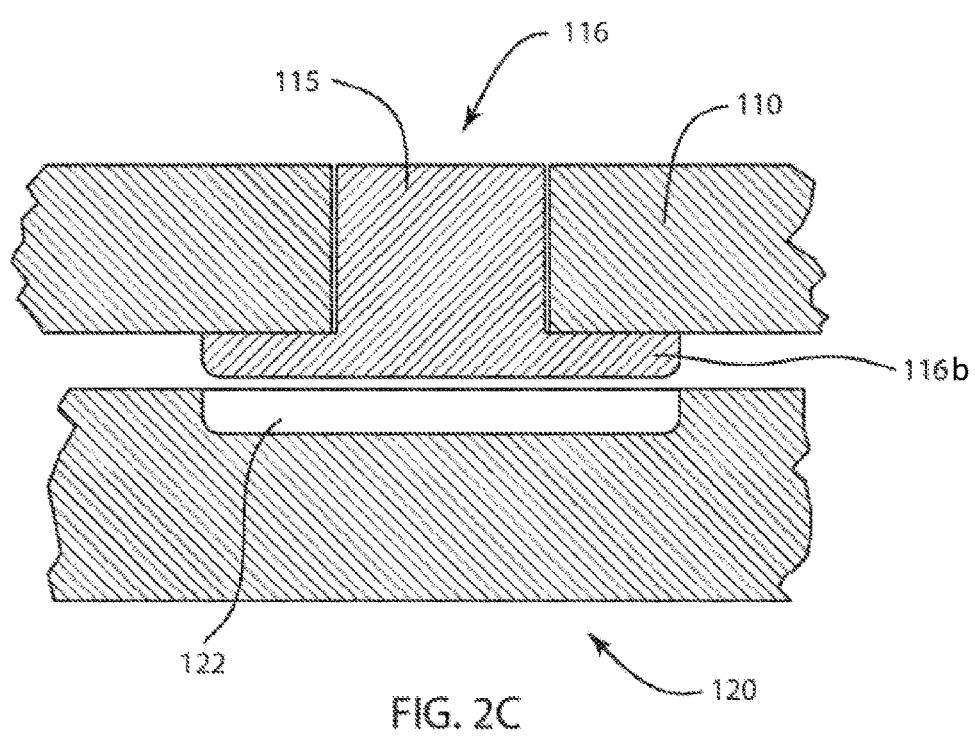

As shown in FIG. 2C, the protective input covering portion 116 is substantially co-extensive with the exterior layer similar to that shown in FIG. 2B, however the protective input covering portion 116 comprises a capacitive part 116b configured to sit beneath the at least one exterior layer 110 and to contact the input portion 122 of the device 120 when operated.

Figure 2D:
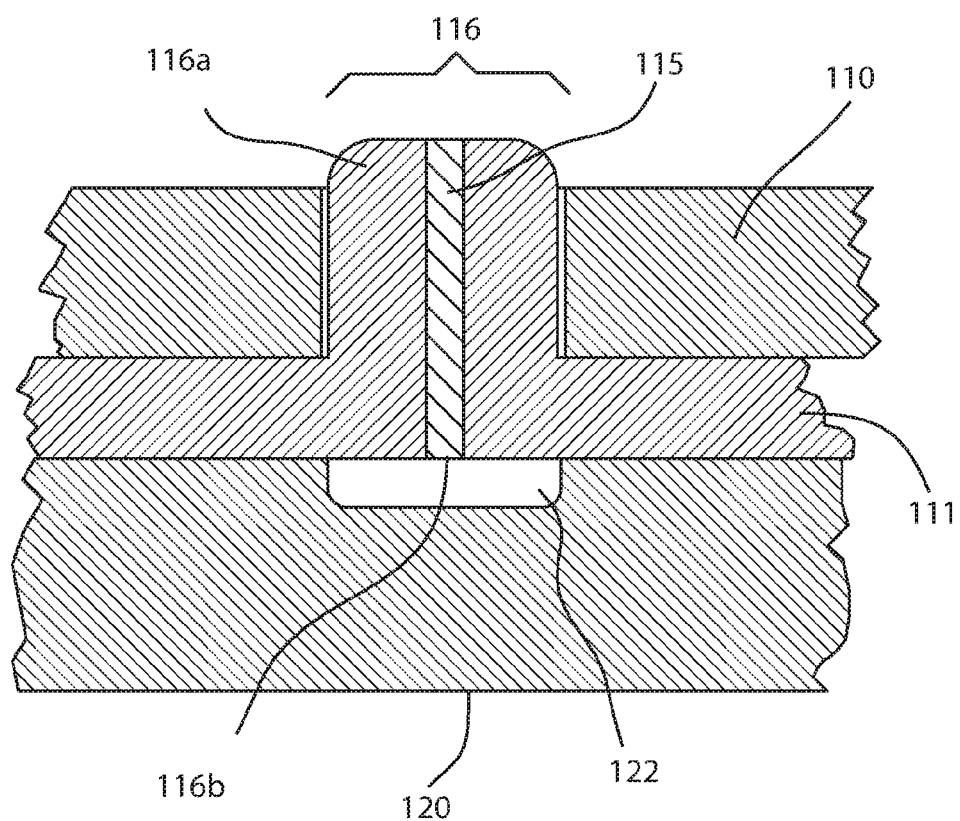

In another embodiment, as shown in FIG. 2D, the case 110 comprises an exterior layer 110 at least one interior layer 111, wherein the interior layer 11 includes an area 116 for the protective input covering portion. An example of a case with more than one layer including an exterior layer 110 and interior layer 111 is disclosed in U S patent application Ser. No. 12/366,769,filed on Feb. 6, 2009 and published as U.S. Pat. Pub 2010/0203931,entitled "One Piece Co-formed Exterior Hard Shell Case with an Elastomeric Liner for Mobile Electronic Devices," the entirety of which is incorporated by reference hereby. The protective case 100 can include an outer layer 110 of the protective case 100, comprising two (or more) separate layers, a first external hard shell layer 110 and a second interior elastomeric layer 111. The first external hard shell layer 110 and a second interior elastomeric layer 111 are combined to independently attach to the electronic device 120, and further includes molded elastomeric covers 116 over device buttons or key inputs 122, accessible though holes 114 in the hard shell 110. The elastomeric layer 111 can be configured to include a shaped projection 116a that forms the button or key input 116, although it need not and can be coextensive with the surface (See FIGS. 2B, 2C). In an the embodiment the protective input covering 116 is provided with a conductive or capacitive material 115 which extends from the surface of the projection 116a to the bottom surface of the interior layer to form a key input that when operative, the capacitive portion 115 generates an electric signal to the key input unit 122.

Figure 3A:
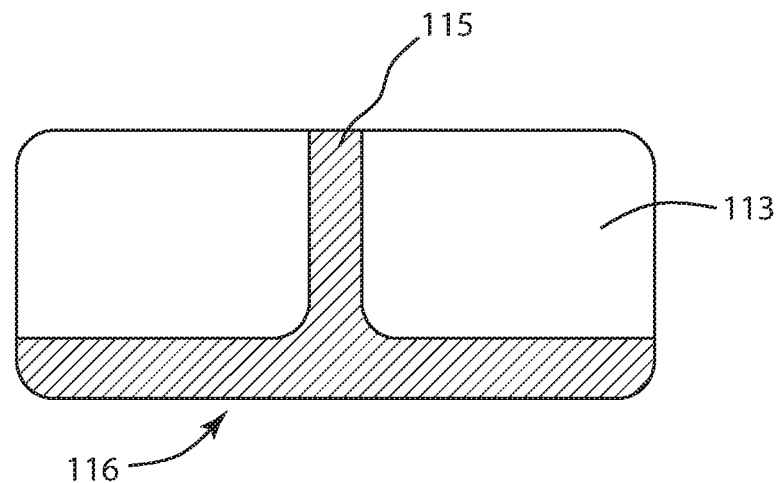
FIGS. 3A and 3B show exemplary embodiments protective inputs covering portions made of conductive or capacitive material.

In another embodiment, protective covering portion 116 can be configured such that only part of the covering portion 116 comprises the capacitive material 115. For example, as shown in FIG. 3A, a protective input covering portion can include an insert of which only part is made of conductive or capacitive material 115, and the remainder 113 of the insert or key is made of a different, non-conductive material.

Figure 3B:
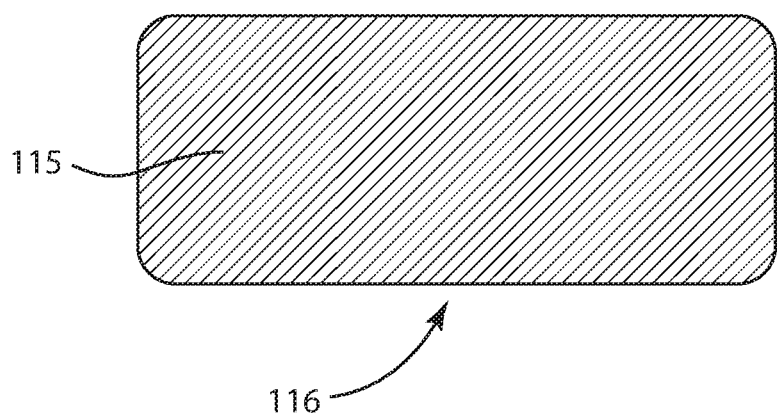
Figure 4:
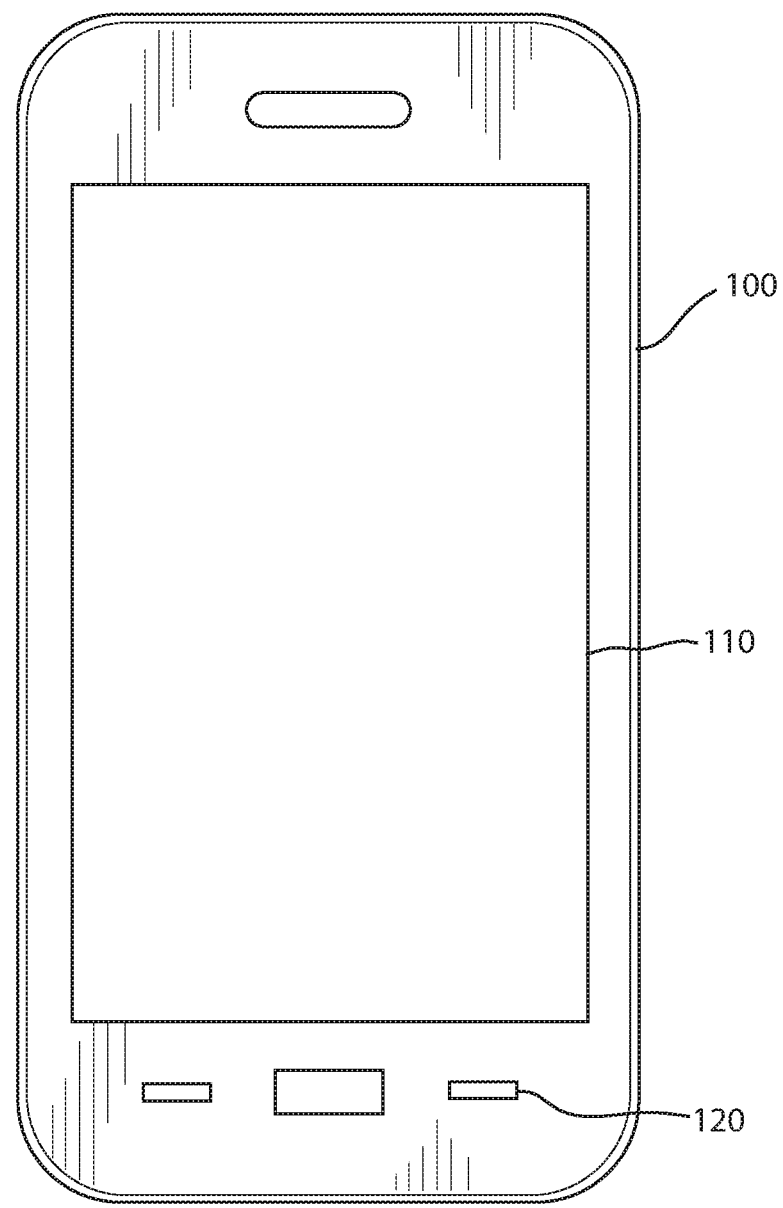
FIG. 4 shows diagram illustrating a communication device.

In another embodiment, substantially all of the protective covering portion comprises one or more capacitive or conductive materials. For example, as shown in FIG. 3B, a protective input covering portion 116 can an insert or key made of conductive or capacitive material 115.

The protective input covering portion 116 can comprise a capacitive insert or part including the capacitive material 115, said capacitive inert or part being inserted, attached, plugged-in, glued, secured, screwed, pinned, set-in, or connected to or put inside of the case 100 such that the user can operate the device using the insert or part. This insert 116 could be mechanically, thermally, chemically, inset-molded, co-molded, or otherwise, integrated or attached into the surrounding case or device. The protective input cover 116 can be integrated as part of a case or jacket. Or, it can be another piece, added to case or jacket, as a separate piece.

In embodiments the protective covering portion 116 can comprise a capacitive insert or part including the capacitive or conductive material, said capacitive inert or part being selected from the group of conductive metals or polymers as known in the art or combinations thereof. The protective covering portion can comprise a capacitive insert or part including the conductive or capacitive material, wherein capacitive or conductive part comprises one or more filaments, wires or threads.

The case 100 may have one or more layers. The protective input cover may have a notch or lip(s), to attach to the case or jacket. Or, one can use glue, screw, pin, small bar, or spring, to attach the protective input cover to the case 100, jacket, device, gadget, or casing.

The material used for case 100 or protective input cover 116 can be selected from the following list (or their combinations): plastic, elastic material, rubber, any artificial material, rigid, soft, flexible, wood, glass, mirror, smooth, rough, coarse material or surface, metal, alloy, nylon, cotton, wool, fabric, natural material, convex, concave, flat surface, quartz, transparent, translucent, opaque material, uniform, or non-uniform surface.

It is appreciated that the optimum dimensional relationships for the parts of the invention, to include variation in size, materials, shape, form, function, and manner of operation, assembly and use, are deemed readily apparent and obvious to one of ordinary skill in the art, and all equivalent relationships to those illustrated in the drawings and described in the above description are intended to be encompassed by the present invention.

Furthermore, other areas of art may benefit from this method and adjustments to the design are anticipated. Thus, the scope of the invention should be determined by the appended claims and their equivalents, rather than by the examples and embodiments given.

The invention claimed is:

1. A case or cover for an electronic device, said case or cover comprising:
at least one exterior layer including an opening configured to provide access to an input component of the electronic device through an exterior of the case or cover; and
a protective input covering portion comprising:
an input contact portion configured to sit beneath the exterior layer and operatively contact the input component while the electronic device is arranged in the case or cover; and
a projection portion adapted to project through the opening;
wherein said protective input covering portion further comprises:
a material that is not capacitive; and
a capacitive material that is operably positioned to operate the input component, said capacitive material being arranged inside the material that is not capacitive.

2. The case or cover of claim 1, further comprising:
a faceplate comprising:
a screen protector;
the at least one exterior layer; and
the protective input covering.

3. The case or cover according to claim 1;
wherein the projection portion is shaped to substantially match the opening such that the exterior layer and the protective input covering portion provide a waterproof or watertight engagement.

4. The case or cover according to claim 1, further comprising:
at least one interior layer, wherein the interior layer includes the protective input covering portion.

5. The case or cover according to claim 1;
wherein an exterior surface of the protective input covering portion is co-extensive with an exterior surface of the exterior layer.

6. The case or cover according to claim 1;
wherein the at least one exterior layer is integrally formed with the protective input covering portion; and
wherein the protective input covering portion comprises a capacitive part configured to sit beneath the exterior layer and contact the input portion when operated.

7. The case or cover according to claim 1;
wherein the capacitive material of said protective covering portion comprises at least one material selected from the group consisting of conductive metals and conductive polymers.

8. The case or cover according to claim 1;
wherein said protective covering portion comprises a capacitive insert or part including the capacitive material, said capacitive insert or part being one or more filaments or wires arranged inside the material that is not capacitive.

9. The case or cover according to claim 1;
wherein said protective input covering portion further comprises:
a capacitive insert or part including the capacitive material,
said capacitive insert or part being inserted, attached, plugged-in, glued, secured, screwed, pinned, set-in, connected to, or put inside of the protective input covering portion such that the user can operate the electronic device using the insert or part when the electronic device is arranged in the case or cover.

10. The case or cover according to according to claim 1;
wherein the case or cover is waterproof or watertight.

11. The case or cover according to claim 1;
wherein the projection portion is adapted to project through the opening and above an exterior surface of the exterior layer.

12. The case or cover according to claim 1;
wherein the capacitive material and the material that is not capacitive are fixedly connected to each other so as not to be movable in relation to each other.

13. The case or cover according to claim 1, further comprising:
    at least one interior layer that comprises:
        the protective input covering portion as a first protective input covering portion; and
        a second protective input covering portion different from the first protective input covering portion, and comprising:
            a second input contact portion configured to sit beneath the exterior layer and operatively contact a second input component while the electronic device is arranged in the case or cover; and
            a second projection portion adapted to project through a second opening in the at least one exterior layer.

14. The case or cover according to claim 1;
    wherein the projection portion of the protective input covering portion is in the shape of a menu icon of the electronic device that is to be arranged in the case or cover.

15. The case or cover according to claim 1;
    wherein the projection portion of the protective input covering portion is in the shape of an arrow.

16. A case or cover for an electronic device, said case or cover comprising:
    at least one exterior layer including an opening configured to provide access to an input component of the electronic device through an exterior of the case or cover; and
    a protective input covering portion comprising:
        an input contact portion configured to sit beneath the exterior layer and operatively contact the input component while the electronic device is arranged in the case or cover; and
        a projection portion adapted to project through the opening;
    wherein said protective input covering portion further comprises;
        a material that is not capacitive; and
        a capacitive material that is operably positioned to operate the input component, said capacitive material being arranged inside the material that is not capacitive; and
    wherein an exterior surface of the protective input covering portion is co-extensive with an exterior surface of the exterior layer.

* * * * *